United States Patent [19]

Yamashita et al.

[11] Patent Number: 5,777,387
[45] Date of Patent: Jul. 7, 1998

[54] SEMICONDUCTOR DEVICE CONSTRUCTED BY MOUNTING A SEMICONDUCTOR CHIP ON A FILM CARRIER TAPE

[75] Inventors: Chikara Yamashita; Akira Yoshigai, both of Tokyo, Japan

[73] Assignee: NEC Corporation, Tokyo, Japan

[21] Appl. No.: 975,658

[22] Filed: Nov. 21, 1997

Related U.S. Application Data

[63] Continuation of Ser. No. 719,982, Sep. 24, 1996, abandoned.

[30] Foreign Application Priority Data

Sep. 29, 1995 [JP] Japan .................................. 7-253629

[51] Int. Cl.$^6$ .......................... H01L 23/00; H01L 23/12; H01L 23/48; H01L 29/44
[52] U.S. Cl. .................... 257/737; 257/738; 257/696; 257/693; 257/692; 257/735
[58] Field of Search .................... 257/668, 669, 257/673, 674, 692, 693, 696, 735, 737, 738

[56] References Cited

U.S. PATENT DOCUMENTS

| 4,939,570 | 7/1990 | Bickford et al. | 257/735 |
| 4,977,441 | 12/1990 | Ohtani et al. | 257/668 |
| 5,075,760 | 12/1991 | Nakashima et al. | 257/668 |

FOREIGN PATENT DOCUMENTS

| 0062533 | 3/1991 | Japan | 257/668 |
| 0062534 | 3/1991 | Japan | 257/668 |
| 3-104133 | 5/1991 | Japan | 257/737 |
| 4-280875 | 10/1992 | Japan | . |
| 0340266 | 11/1992 | Japan | 257/737 |
| 0359530 | 12/1992 | Japan | 257/668 |

OTHER PUBLICATIONS

Nikkei Microdevice Journal, pp. 58–64, Mar. 1994.

*Primary Examiner*—Tom Thomas
*Assistant Examiner*—Alexander Oscar Williams
*Attorney, Agent, or Firm*—Sughrue, Mion, Zinn, Macpeak & Seas, PLLC

[57] ABSTRACT

Copper foil wiring is applied to base film and the wiring is in turn covered by a cover resist. The electrodes of a semiconductor IC chip is connected to the inner leads of the copper foil wiring and the semiconductor chip is then encapsulated by encapsulation resin. Solder balls are supplied to lands through openings in the cover resist, and bumps are formed. The four sides of the film are then folded to form folded portions. These folded portions increase the strength of the edges of the film, thereby reducing warping and waviness and allowing simultaneous mounting of other devices such as QFP to the substrate. The angle of folding with respect to the film surface is preferably 20° or greater and less than 90°, and still greater strength can be obtained by two-stage folding of the sides.

6 Claims, 7 Drawing Sheets

55

55a  55d
55b  55c

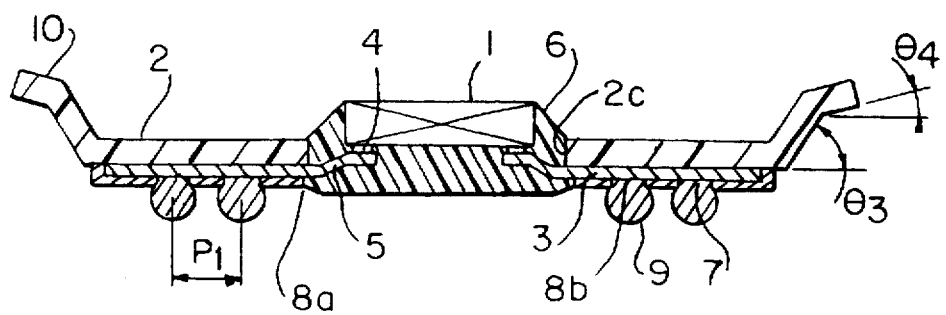
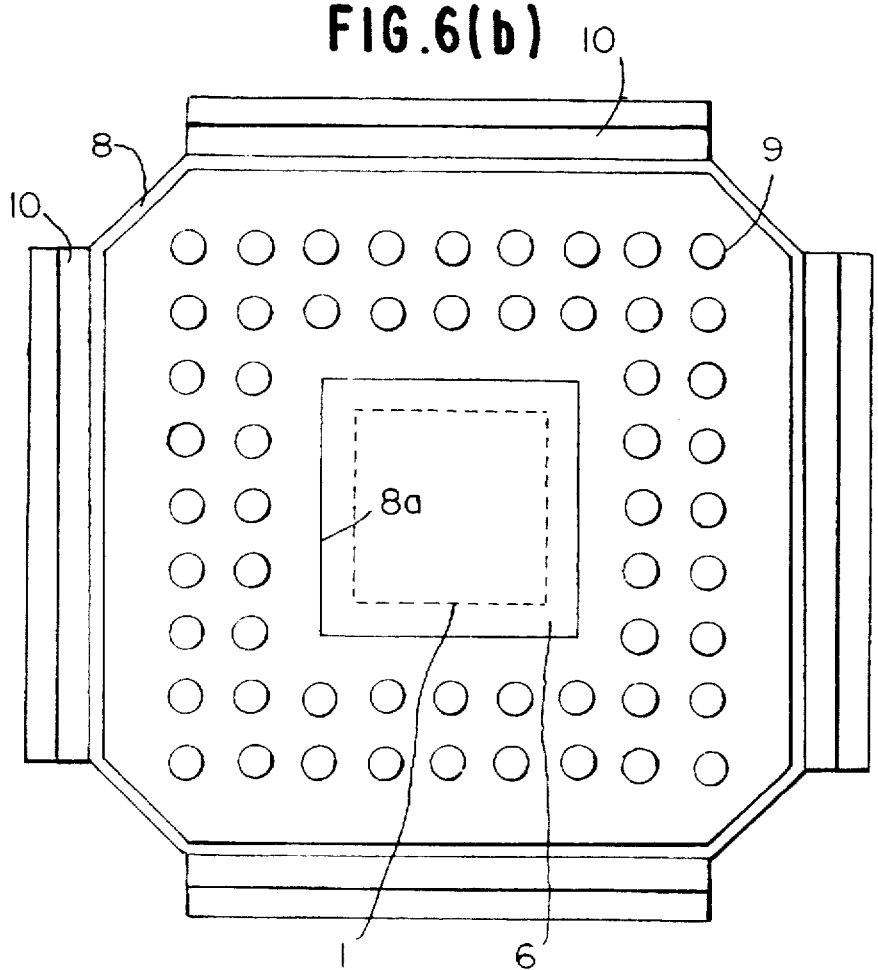

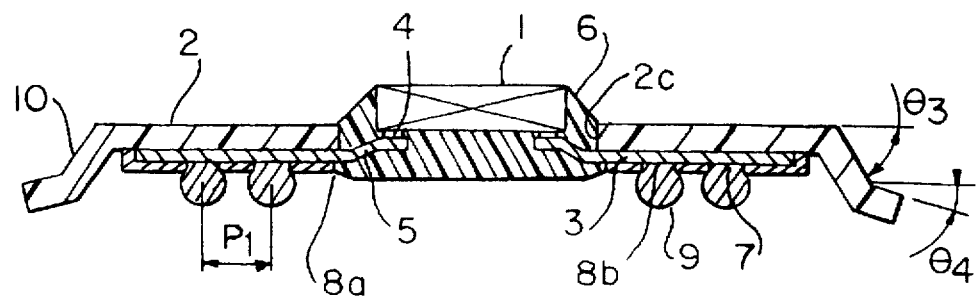
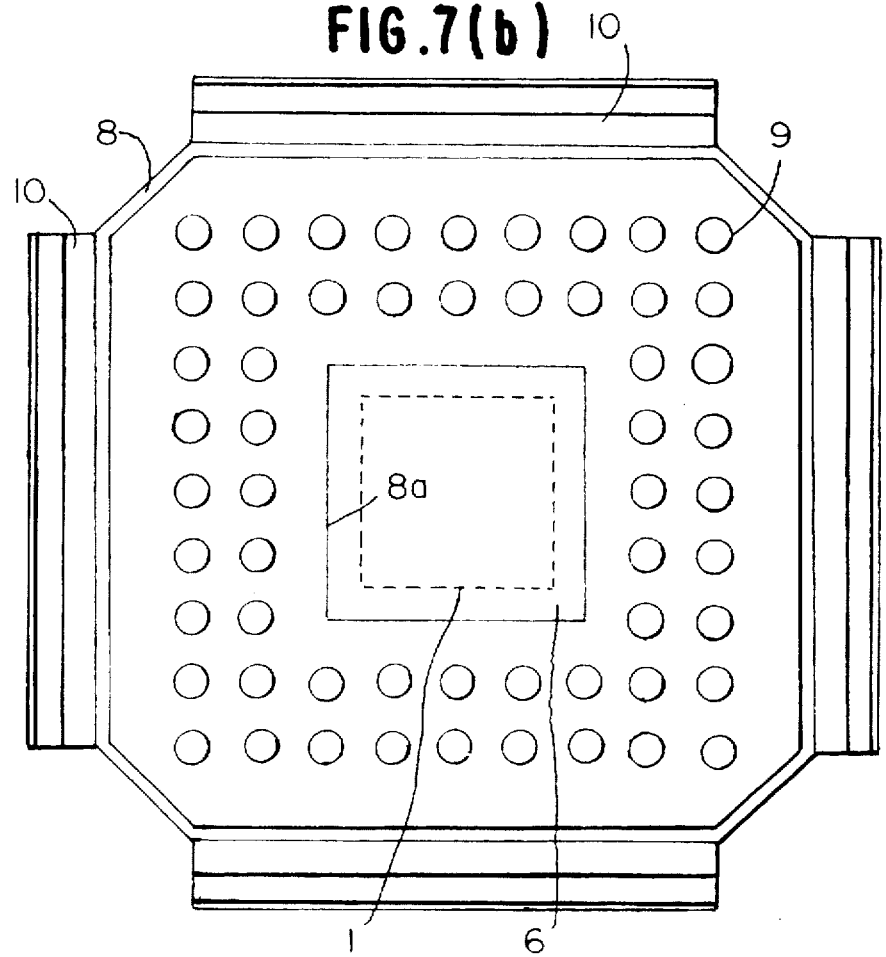

SEMICONDUCTOR DEVICE CONSTRUCTED BY MOUNTING A SEMICONDUCTOR CHIP ON A FILM CARRIER TAPE

This is a Continuation of application Ser. No. 08/719,982 filed Sep. 24, 1996, now abandoned.

BACKGROUND OF THE INVENTION

1. Field of the Invention

The present invention relates to a semiconductor device constructed by mounting a semiconductor IC chip on a film carrier tape, and particularly relates to a semiconductor device in which bumps are arranged in a grid array on a film carrier tape and a semiconductor IC chip is connected to the package substrate by means of the bumps.

2. Description of the Related Art

In a semiconductor device using a film carrier tape according to the prior art, an insulation film of polyimide, polyester, glass, or epoxy is employed as a base film, and on this base film, which has sprocket holes for carrying and positioning and a device hole which is an open portion for arranging a semiconductor IC, a metal foil such as copper is bonded by an adhesive, and leads and electrical selective pads of a desired form are formed in the metal foil by a process such as etching.

Leads (inner leads) extending into the device hole of a film carrier tape formed in this way are connected by inner lead bonding (hereinafter abbreviated ILB) to bumps, which are metal protuberances provided in advance on the electrode terminals of an IC chip, through a process of thermal compression bonding or eutectic bonding. Electrical selection or burn-in tests are carried out in the film-carrier-tape state, and the leads are next cut to desired lengths to enable outer lead bonding (hereinafter abbreviated OLB).

At this time, one method commonly used to prevent splaying of the outer lead bonding section of the leads for a multipin configuration having numerous leads involves leaving the insulation film making up the film carrier tape, which is composed of, for example, polyimide, at the outer ends of the outer leads. Mounting is then carried out by OLB of the leads to bonding pads on, for example, a printed board.

In packaging a semiconductor device using this type of film carrier tape, an OLB bonder specifically for the film carrier tape is required when carrying out OLB of the printed board in order to ensure coplanarity of the OLB leads due to the extreme thinness of the OLB leads, which are about 35 µm thick.

In addition, when mounting a semiconductor device together with other mountable packages such as quad flat packages (QFP) by collective reflow, mounting by separate processes other than a reflow process has been necessary. As a result, film carrier tape semiconductor devices have not been widely employed for special-purpose packages.

The outer reflow pitch of QFP that allow reflow is limited to about 0.4 mm. As one example that surpasses this limit, the NIKKEI MICRODEVICES Journal (March 1994 Edition, pp. 58–64) describes a surface-mounting ball grid array (BGA) in which solder bumps are arranged in a grid as external terminals on the reverse surface of a package. Such a package features excellent packageability and allows a pitch on the order of 1.5 mm when mounting a package of the 220-pin class measuring 23–24 mm on each side.

In addition, because BGA results in a package having small outer dimensions, wiring length within the package can be reduced, thereby obtaining an improvement in electrical characteristics. A multilayer printed board is used for the substrate of such a BGA package, but a ceramic substrate or film carrier tape may also be used. FIG. 1 shows an example of a BGA package using a film carrier tape. This example will hereinafter be referred to as the first example of the prior art. FIG. 1(a) shows a sectional view of such a package, and FIG. 1(b) shows a plan view.

Such a BGA package 30 is formed from: a film carrier tape 32a in which copper foil wiring 33 is applied to the lower surface of base film 32; cover resist 38 covering the lower surface of copper foil wiring 33 and film carrier tape 32a; solder bumps 39 formed as external terminals using solder balls on lands 37 formed over copper foil wiring 33 on film carrier tape 32a; semiconductor IC chip 31 having electrodes 34 connected to inner leads 35 of copper foil wiring 33; and resin 36 for encapsulating and protecting the surface of one portion of the semiconductor IC chip. When mounting this BGA package on a substrate, solder paste is first supplied to pads on the package substrate, and mounting is achieved by establishing connection with solder bumps 39.

FIGS. 2(a) to (e) are sectional views at different stages to illustrate the method of fabricating the first example of the prior art described hereinabove. First, as shown in FIG. 2(a), ILB of inner leads 35 of film carrier tape 32a illustrated in FIG. 1 to electrodes 34 of semiconductor IC chip 31 is carried out. Then, as shown in FIG. 2(b), resin is supplied by a potting method to the surface of semiconductor IC chip 31, and the resin is allowed to harden to form encapsulation resin 36. As shown in FIG. 2(c), flux is applied to lands 37 of copper foil wiring 33, following which solder balls are supplied, and solder bumps 39 are formed by reflowing. As shown in FIG. 2(d), BGA package 30, i.e., a film carrier-type BGA semiconductor device which has been fabricated in this way, can be mounted by supplying solder paste 11 to lands 12 on package substrate 13 and performing a collective reflow through solder bumps 39.

In a BGA package of the form in which such a film carrier tape is used, polyimide (PI) is generally employed as the base film material and the tape thickness is usually about 50–125 µm. As a result, the base film lacks sufficient mechanical strength as a substrate and is prone to warping and waviness. The bonding of a stiffener to the substrate has been proposed as a means of eliminating these problems.

Alternatively, Japanese Patent Laid-open No. 280875/92 proposes a method of reinforcing the edges of a substrate as a means of preventing warping of a thin substrate. Such a method will be described as the second example of the prior art. FIGS. 3(a)–(c) are perspective views of a green sheet of the second example of the prior art. According to this method, when fabricating a thin ceramic substrate having a thickness of 30–200 µm, warping and waviness brought about by sintering can be prevented by folding back each of edges 55a, 55b, 55c, and 55d to an angle of 180° while in the state of green sheet 55, following which the tape is secured within setters and sintered.

In the above-described first example of the prior art in which a film carrier tape is used in a BGA package, the material of the base film is generally polyimide (PI) having a thickness of 50–125 µm, and the substrate is therefore lacking in mechanical strength and prone to warping and waviness.

When carrying out a reflow process from the state shown in FIG. 2(d), the reflow temperature is set to a maximum of 240° C.–260° C. The thermal expansion coefficients of the base film formed of PI and the copper foil wiring at a temperature range of 200° C.–300° C. are 15–16 ppm and 16–17 ppm. respectively, and due to this difference between their thermal expansion coefficients, stress arises between the base film and copper foil during reflow. As a result, the phenomenon occurs that the base film warps upward with respect to the package substrate as shown in FIG. 2(e). For this reason, the problem is encountered that solder bumps disposed distant from the center and closer to the sides do not adhere to the package substrate, resulting in unconnected portions 14. Moreover, this tendency becomes more pronounced as the outer dimensions of a BGA package increase to, for example, 40 mm on a side and as the number of pins increases to, for example 600–700 pins, with the result that the feature of a BGA package, i.e., ease of packaging, is lost.

Although the bonding of a stiffener to the base film has been proposed as a means of reducing the above-described warping, such a process is not only complex and troublesome but lacks sufficient effect.

Furthermore, although the method of preventing warping and waviness due to sintering by folding back the edges of a ceramic substrate 180° while in a green sheet state as described in the second example of the prior art does have the effect of reducing warping of the substrate after sintering, the application of this method to a film carrier tape is difficult to implement. The base film tape material is generally polyimide (PI) as described hereinabove and the tensile strength of such material is as high as 20–40 kg/mm², and consequently, folding the edges 180° only once does not achieve the desired effect, while the application of complicated procedure in which two or more folding steps are carried out entails great increases in manufacturing costs and results in an expensive package.

SUMMARY OF THE INVENTION

The object of the present invention is to provide a semiconductor device which is a BGA package semiconductor device employing a film carrier tape that prevents warping or waviness of the base film due to the heat of reflowing, prevents the occurrence of disconnected portions between solder bumps and a package substrate, and moreover, features low cost and superior packageability for mass production.

To achieve the above-described objects, a semiconductor device of the present invention is provided with: a film carrier tape comprising a base film in which a device hole is formed and metal foil wiring bonded onto the base film with one end projecting into the device hole and forming inner leads and the outer side of the other end portion forming lands for connection with bumps; a cover resist covering the film carrier tape including the metal foil wiring, said cover resist having openings for connecting bumps to lands on the metal foil wiring, and having an open portion of substantially the same shape as the device hole; a semiconductor IC chip having electrodes connected to the inner leads of the metal foil wiring; encapsulation resin for protecting the semiconductor IC chip; and bumps of conductive material formed on the lands of the metal foil wiring; wherein an edge of each side of the base film is folded back.

The edge of each side of the above-described base film is folded to form angles with respect to the surface of the base film, the folding angle preferably being in a range of 20° or greater and less than 90° on the side opposite the bumps; in a range of 20° or greater and less than 90° on the same side as the bumps; in a range of 30° or greater and less than 90° on the side opposite the bumps followed by additional folding of the tip portions such that the angle of the tip portions with respect to the base film surface is less than 30°; or in a range of 30° or greater and less than 90° on the same side as the bumps followed by additional folding of the tip portions such that the angle of the tip portions with respect to the base film surface is less than 30°.

A semiconductor device according to the present invention is a BGA package-type device in which a semiconductor IC chip is mounted on a film carrier tape, bumps being arranged in a grid array on the film carrier tape, and the connection of the semiconductor IC chip to the package substrate being effected through these bumps. Metal foil wiring for establishing connection with a semiconductor chip is applied to the base film forming the film carrier tape. The semiconductor device is formed by cutting and forming the film carrier tape using a die. At the same time, the folded portions of the edges of the base film are formed, and due to the reinforcement of the strength of the four sides of the base film contributed by these folded portions, the warping or waviness of the base film arising during reflow can be reduced.

The function of the folded portions formed on the four edges of the base film will next be explained. The material of the base film is generally polyimide having a thickness of from 50 to 125 μm. The temperature when carrying out the reflow process with a semiconductor device on the package substrate reaches 240° C.–260° C., and the thermal expansion coefficients of a base film formed from polyimide and metal foil wiring (generally of copper foil) within a temperature range of 200° C. to 300° C. is 15–16 ppm and 16–17 ppm, respectively. Consequently, stress is generated during reflowing by the difference between the thermal expansion coefficients of the base film and copper foil, the upper surface side of the base film on the package substrate tends to warp into a concave shape, and as a result, solder bumps arranged on the sides and far from the central portion of the base film fail to make contact with the package substrate. Increasing the strength of the edge portions of the base film is effective in preventing this warping of the base film. As described in the prior art, such methods include bonding a stiffener to the base film or folding back the edges 180°, but these methods are unsuitable for the reasons earlier described.

According to the present invention, an effective countermeasure involves folding the edges of the base film within a range of 20° or more and less than 90° with respect to the film surface, or folding the edges in two sections. A folding angle of 20° or greater is required because an angle less than 20° contributes little strength, leading to easy warping, while an angle less than 90° is required because angles equal to or greater than 90° not only necessitate a two-stage folding process, which increases cost, but contribute no greater effect in terms of prevention of warping than angles less than 90°.

As explained hereinabove, forming folded portions in the four sides of the base film of the film carrier tape that forms a semiconductor device increases the strength of the edges of the base film, thereby enabling a reduction in the amount of warping and waviness of the base film caused by stress arising during reflowing due to differences between the thermal expansion coefficients of the base film and copper foil wiring, and as a result, the present invention has the effect of enabling simultaneous mounting of surface mount devices other than, for example, a QFP to a package substrate by a collective reflow method, and moreover, because unconnected portions do not occur, the present invention has the added effects of improving workability in mounting and decreasing costs.

The above and other objects, features, and advantages of the present invention will become apparent from the following description based on the accompanying drawings which illustrate examples of preferred embodiments of the present invention.

BRIEF DESCRIPTION OF THE DRAWINGS

FIG. 6(a) is a schematic sectional view, and FIG. 6(b) is a schematic plan view, of another semiconductor device according to the present invention.

FIG. 7(a) is a schematic sectional view, and FIG. 7(b) is a schematic plan view, of another semiconductor device according to the present invention.

DETAILED DESCRIPTION OF THE PREFERRED EMBODIMENTS

Figure 4A:
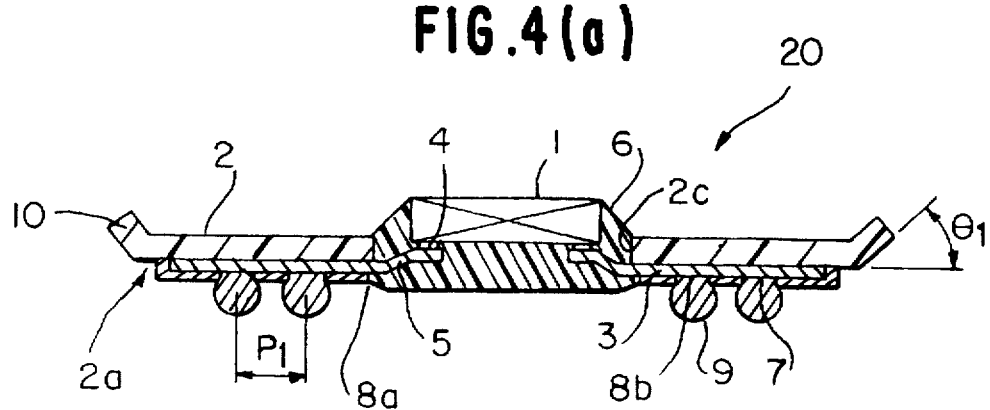
FIG. 4(a) is a schematic sectional view.
Figure 4B:
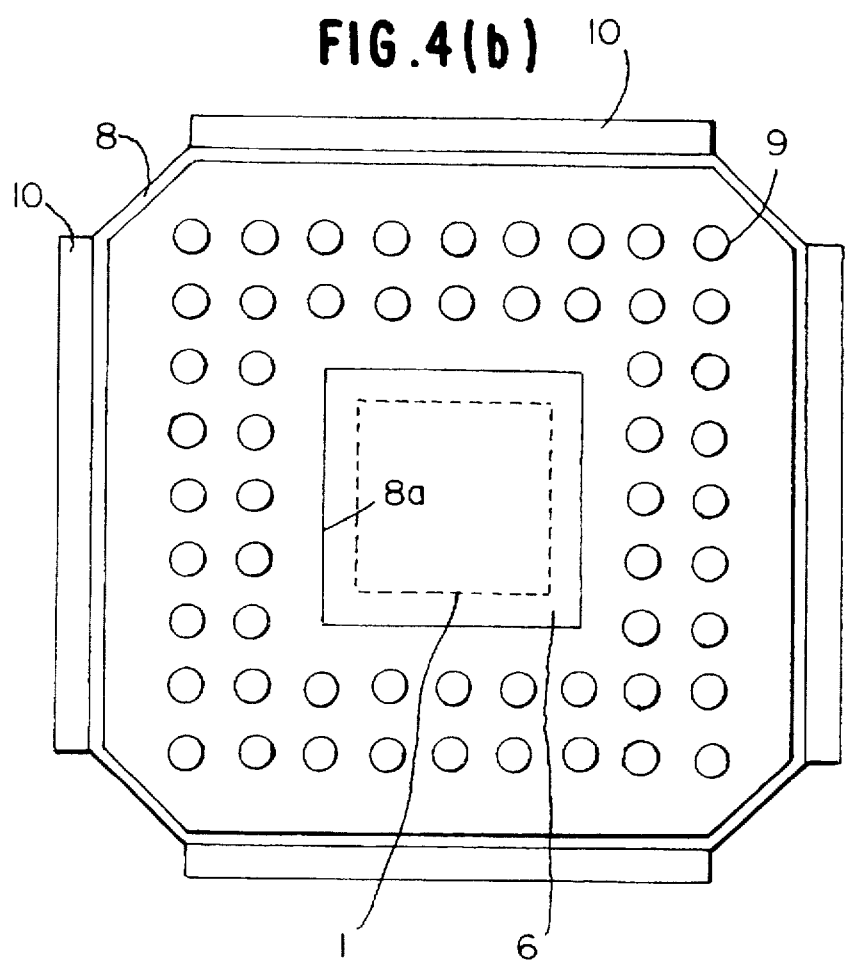
FIG. 4(b) is a schematic plan view, of a semiconductor device according to the present invention.

The embodiments of the present invention will next be explained with reference to the accompanying figures. FIG. 4(a) is a schematic sectional view, and FIG. 4(b) is a schematic plan view, of a semiconductor device according to the present invention.

This semiconductor device 20 is a Ball Grid Array (BGA) package using a film carrier tape. Base film 2 is a polyimide film having a thickness of 50 to 125 μm with device hole 2c provided in its central portion. Film carrier type 2a is formed by bonding copper foil wiring 3, which is formed by carrying out such processes as resist application, exposure, development, and etching on a copper-clad tape for metal foil wiring use, to base film 2, and arranging inner leads 5 provided on the inner tip portions of copper foil wiring 3 so as to project toward the center of device hole 2c. Semiconductor IC chip 1 having electrodes 4 is arranged inside device hole 2c with inner leads 5 connecting at electrodes 4, and secured to base film 2 by encapsulation resin 6 which serves to protect these components. Cover resist 8 formed in a prescribed pattern produced by, for example, a screen printing method, is coated on the portions in which copper foil wiring 3 is disposed on film carrier tape 2a. Openings 8b formed in cover resist 8 for solder bumps 9 are disposed in a grid array, and lands 7 for connection with the exterior are formed on the surface of copper foil wiring 3. Opening 8a in the central portion of cover resist 8 is substantially the same shape as device hole 2c and its center is filled in by encapsulation resin 6. Solder bumps 9 are connected to copper foil wiring 3 at lands 7. If pitch $P_1$ of solder bumps 9 is 1.27 mm, the diameter of openings 8b in cover resist 8 is from 0.4 to 0.6 mm, solder balls measuring from 0.7 to 0.9 mm in diameter are supplied at lands 7, and solder bumps 9 having a bump height of from 0.5 to 0.8 mm are formed on lands 7 by reflowing.

Such a film carrier tape 2a, which is provided with semiconductor IC chip 1, is cut and formed using cutting and forming dies to form semiconductor device 20, and simultaneous with this cutting and forming, folded portions 10 are formed in the four edges of the base film. By forming these folded portions, the strength of the edges of the base film is reinforced, and deformation such as warping and waviness can be greatly reduced.

The tensile strength of polyimide, which is the base film material, is from 20 to 40 kg/mm², and a single forming process of folding the edge as far as 90° may be performed without fear of creating cracks in the folded portions.

A folding angle equal to or greater than 20° with respect to the base film surface is effective in preventing warping or waviness. Folding angles of 90° or more are disadvantageous because such angles require a two-step forming process and a consequent increase in costs but make no contribution to the prevention of warping. Accordingly, using the base film surface as reference, folding angle $\theta_1$ shown in FIG. 4(a) is $20° \leq \theta_1 < 90°$ when carrying out one-step folding.

Figure 5A:
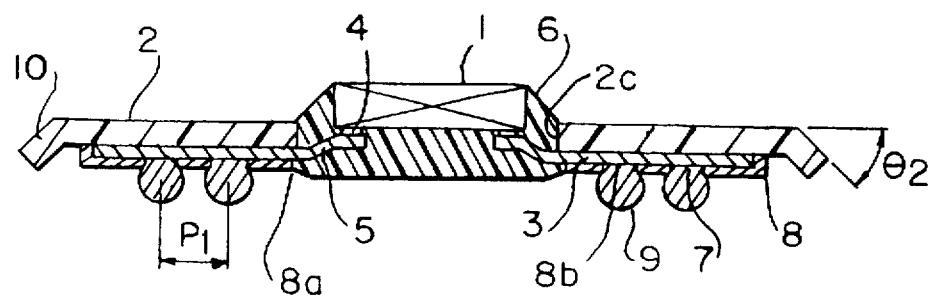
FIG. 5(a) is a schematic sectional view.
Figure 5B:
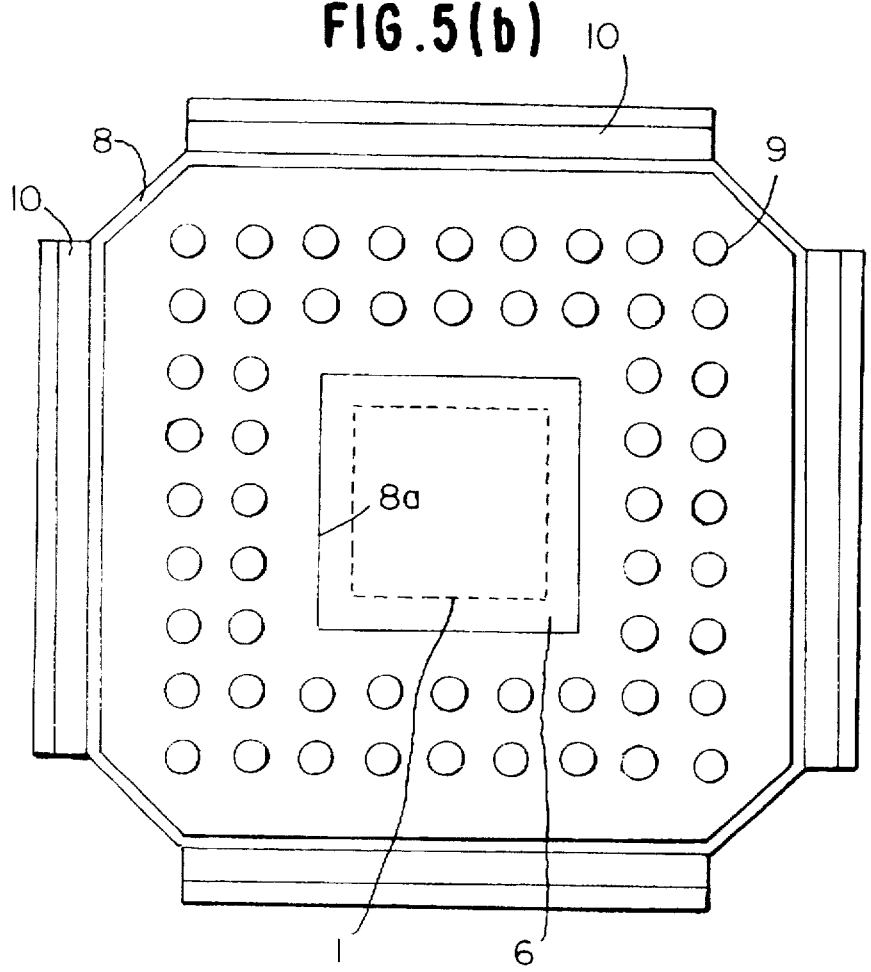
FIG. 5(b) is a schematic plan view, of another semiconductor device according to the present invention.

This folding angle has an equal effect even when folding toward the side of solder bumps 9 as shown in FIG. 5(a), and in such a case the folding angle $\theta_2$ is again $20° \leq \theta_2 90°$.

The preventive effect against warping can be further increased by two-step folding as shown in FIG. 6(a). In such a case, the folding angle $\theta_3$ is within the range $30° \leq \theta_3 < 90°$ and folding angle $\theta_4$ is within the range $0° \leq \theta_4 < 30°$.

In addition, as shown in FIG. 7(a), if folding angles $\theta_3$ and $\theta_4$ used in two-step folding are turned toward the side of solder bumps 9 in forming folded portion 10, the same effect can be obtained as for that shown in FIG. 6(a).

Figure 1A:
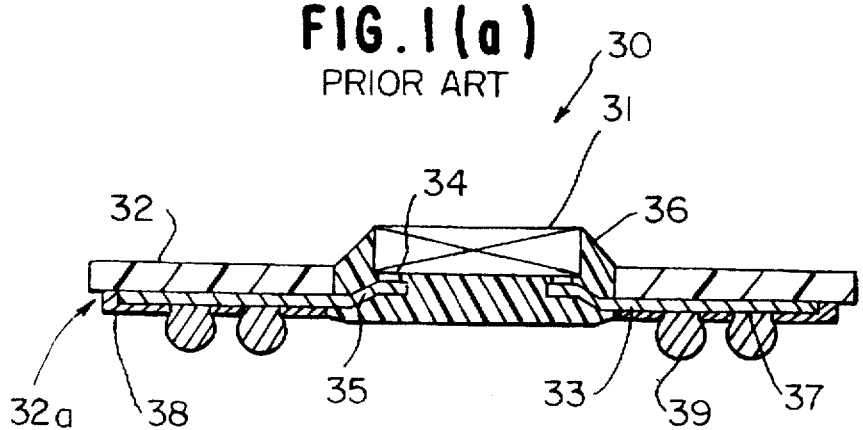
FIG. 1(a) is a schematic sectional view.
Figure 1B:
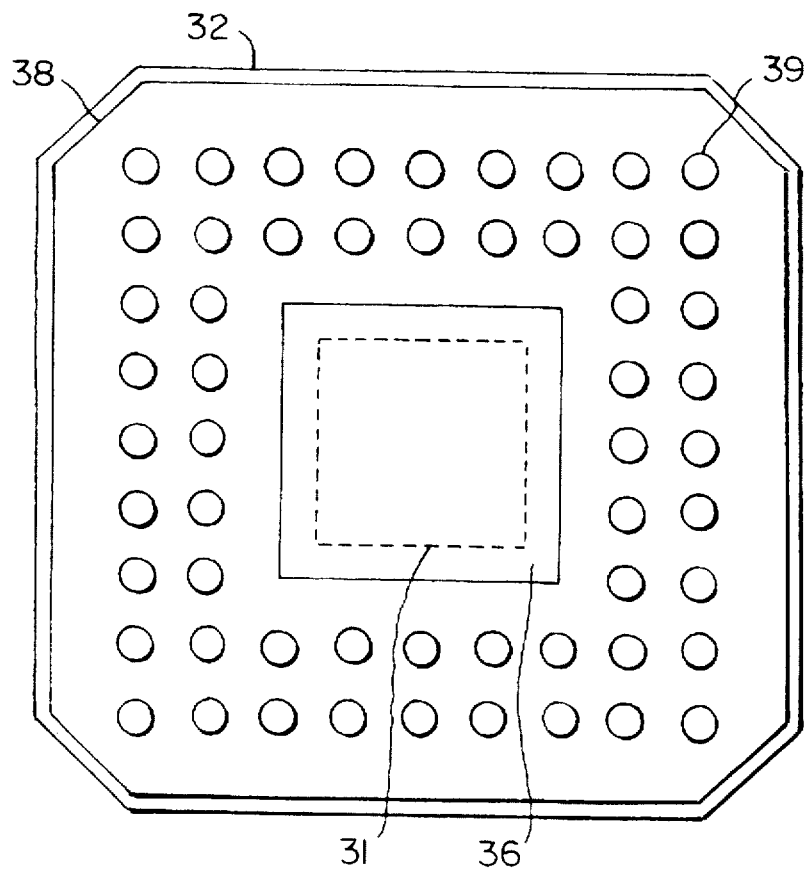
FIG. 1(b) is a schematic plan view, of a semiconductor device of the first example of the prior art.
Figure 2A:
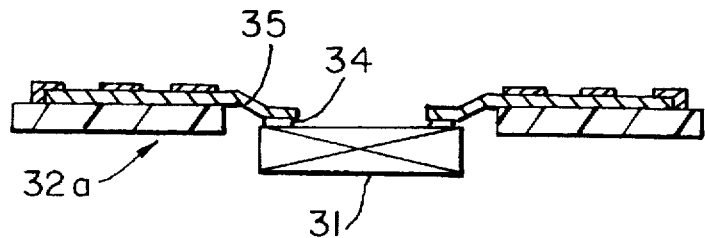
FIGS. 2(a)–(e) are sectional views of the sequence of manufacturing processes to illustrate the manufacturing method of the semiconductor device of FIG. 1.
Figure 2B:
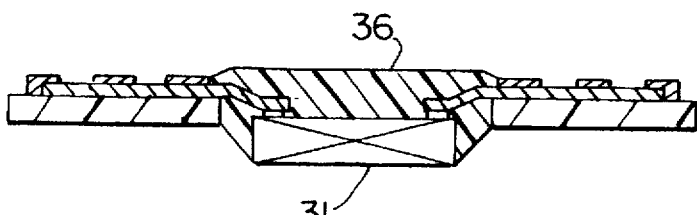
Figure 2C:
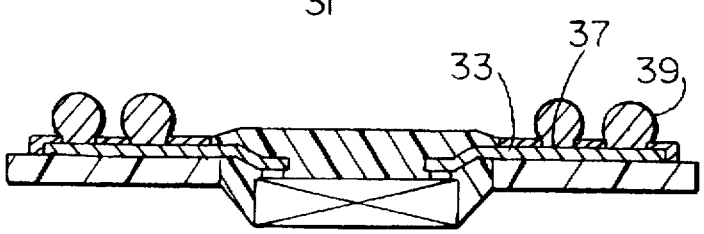
Figure 2D:
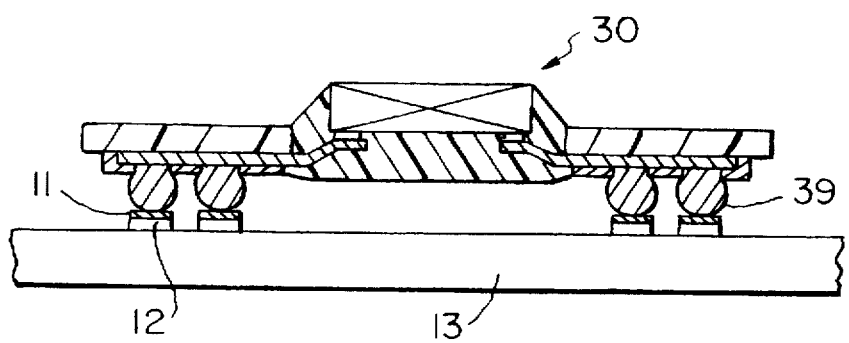
Figure 2E:
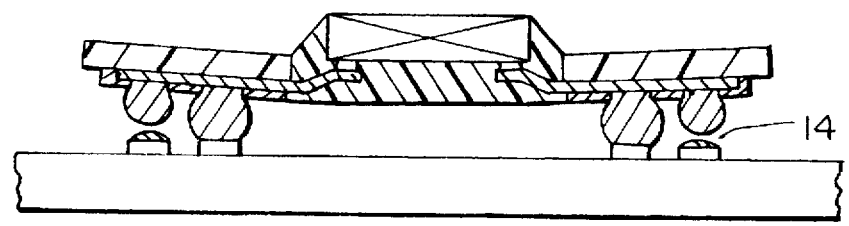
Figure 3A:
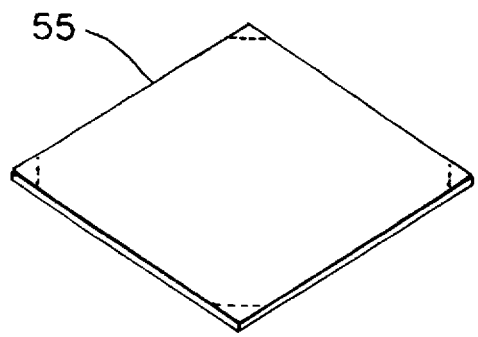
FIGS. 3(a)–(c) are perspective schematic views showing the sequence of manufacturing process of the substrate of the second example of the prior art.
Figure 3A:
Figure 3B:
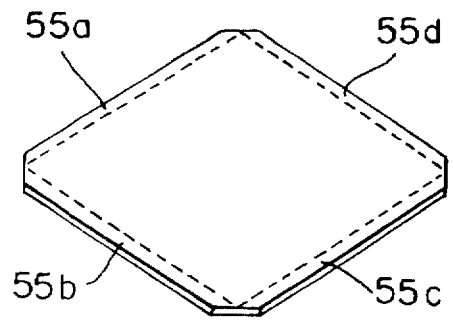
Figure 3B:
Figure 3C:
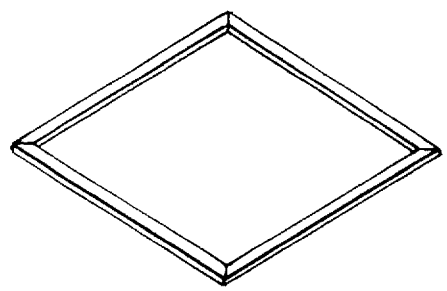

Forming folded portions in the four sides of the base film in this manner enables both an increase in the strength of the edges of the base film and a reduction in the amount of deformation such as warping and waviness. For example, for a package measuring 40 mm on a side, the amount of warping in a prior-art case was from 0.2 to 0.3 mm, but a reduction in the amount of warping to less than 0.1 mm was realized by forming folded portions. As a result, when mounting film carrier-type BGA packages to package substrates, a prior-art packaging method such as shown in FIG. 2(d) can be applied without giving rise to unconnected portions such as shown in FIG. 2(e). Moreover, this improvement enables low-cost manufacturing because such a BGA package can employ an inexpensive film carrier tape of 3-layer single-metal construction.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A semiconductor device comprising:
    a film carrier tape comprising a base film, in which a device hole is formed, and metal foil wiring which is bonded onto said base film, said metal foil wiring having one end portion projecting into said device hole and forming inner leads and having an outer side of another end portion thereof forming lands;
    a cover resist covering said film carrier tape including said metal foil wiring, said cover resist having openings corresponding to said lands on said metal foil wiring and having an open portion of substantially the same shape as said device hole;
    a semiconductor chip having electrodes connected to said inner leads of said metal foil wiring which is disposed in said device hole;

encapsulation resin for protecting said semiconductor chip; and bumps of conductive material which are formed in each of the openings of said cover resist on said lands of said metal foil wiring;

wherein said base film includes an outer region which extends beyond the metal foil wiring;

wherein an edge of each of a plurality of sides of said base film is folded back so that a corresponding folded portion of said base film is formed; and wherein a crease of said corresponding folded portion of said base film is included in said outer region.

2. A semiconductor device according to claim 1 wherein the edge of each of the plurality of sides of said base film are folded toward a side of said base film which is opposite to a side of said base film upon which said bumps are formed, and wherein a folding angle of said edge with respect to a plane defined by a surface of said base film is in a range of 20° or greater but less than 90°.

3. A semiconductor device according to claim 1 wherein the edge of each of the plurality of sides of said base film are folded towards a side of said base film on which said bumps are formed, and wherein a folding angle of said edge with respect to a plane defined by a surface of said base film is in a range of 20° or greater but less than 90°.

4. A semiconductor device according to claim 1 wherein the edge of each of the plurality of sides of said base film is folded towards a side of said base film which is opposite to a side of said base film upon which said bumps are formed such that a first folding angle of said edge is formed with respect to a first plane defined by a surface of said base film which is in a range of 30° or greater but less than 90°; and wherein a tip portion of said edge is further folded such that a second angle of said tip portion is formed with respect to a second plane that is parallel to the first plane defined by the surface of said base film, said second angle being less than 30°.

5. A semiconductor device according to claim 1 wherein the edge of each of the plurality of sides of said base film is folded towards a side of said base film upon which said bumps are formed such that a first folding angle of said edge is formed with respect to a first plane defined by a surface of said base film which is in a range of 30° or greater but less than 90°; and wherein a tip portion of said edge is further folded such that a second angle of said tip portion is formed with respect to a second plane which is parallel to the first plane defined by the surface of said base film, said second angle being less than 30°.

6. A semiconductor device according to claim 1, wherein said plurality of sides comprises at least four sides of said base film.

* * * * *